(12) United States Patent
Yu et al.

(10) Patent No.: US 9,093,489 B2
(45) Date of Patent: Jul. 28, 2015

(54) SELECTIVE CURING METHOD OF ADHESIVE ON SUBSTRATE

(71) Applicant: Taiwan Semiconductor Manufacturing Company, Ltd., Hsin-Chu (TW)

(72) Inventors: Tu-Hao Yu, Hsin-Chu (TW); Wen-Chih Chiou, Miaoli (TW); Hung-Jung Tu, Hualien (TW); Yu-Liang Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 69 days.

(21) Appl. No.: 13/897,031

(22) Filed: May 17, 2013

(65) Prior Publication Data

US 2014/0261997 A1   Sep. 18, 2014

Related U.S. Application Data

(60) Provisional application No. 61/794,360, filed on Mar. 15, 2013.

(51) Int. Cl.
| | |
|---|---|
| *B29C 65/48* | (2006.01) |
| *B32B 37/00* | (2006.01) |
| *B32B 43/00* | (2006.01) |
| *C08J 5/12* | (2006.01) |
| *C09J 5/00* | (2006.01) |
| *H01L 21/683* | (2006.01) |

(52) U.S. Cl.
CPC ........ *H01L 21/6836* (2013.01); *H01L 21/6835* (2013.01); *H01L 2221/6834* (2013.01); *H01L 2221/68318* (2013.01); *H01L 2221/68327* (2013.01); *Y10T 156/10* (2015.01)

(58) Field of Classification Search
CPC ................. H01L 21/67092; H01L 21/6835; H01L 21/6836; B29C 65/14; B29C 65/1406; B29C 65/16; B29C 65/48; B29C 65/4845; B29C 2035/0827; B29C 2035/0838; B32B 2457/14; C09J 5/06; C08J 5/12; C08J 5/124
USPC ............. 156/247, 272.2, 275.1, 275.5, 275.7, 156/307.1, 307.3, 307.7, 701
See application file for complete search history.

(56) References Cited

U.S. PATENT DOCUMENTS

| | | | | |
|---|---|---|---|---|
| 7,229,852 | B2 * | 6/2007 | Hoshika | 438/118 |
| 2006/0286768 | A1 * | 12/2006 | Arana et al. | 438/455 |
| 2011/0069467 | A1 * | 3/2011 | Flaim et al. | 361/807 |
| 2012/0248065 | A1 * | 10/2012 | Kawamura et al. | 216/66 |

* cited by examiner

*Primary Examiner* — Sing P Chan
(74) *Attorney, Agent, or Firm* — Slater & Matsil, L.L.P.

(57) ABSTRACT

Embodiments of the present disclosure include methods of forming a semiconductor device. An embodiment is a method for forming a semiconductor device, the method including applying a substrate to a carrier with an adhesive layer between the carrier and the substrate, curing a portion of the adhesive layer, the cured portion surrounding an uncured portion of the adhesive layer, removing the carrier from adhesive layer, removing the uncured portion of the adhesive layer, and removing the cured portion of the adhesive layer.

24 Claims, 3 Drawing Sheets

SELECTIVE CURING METHOD OF ADHESIVE ON SUBSTRATE

This application claims the benefit of U.S. Provisional Application No. 61/794,360, filed on Mar. 15, 2013, entitled Selective Curing Method of Adhesive on Substrate, which application is hereby incorporated herein by reference.

BACKGROUND

Since the invention of integrated circuits, the semiconductor industry has experienced continuous rapid growth due to constant improvements in the integration density of various electronic components (i.e., transistors, diodes, resistors, capacitors, etc.). For the most part, these improvements in integration density have come from repeated reductions in minimum feature size, allowing more components to be integrated into a given chip area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum size needed to make these components. Also, when more devices are put into one chip, more complex designs are required. An additional limitation comes from the significant increase in the number and length of interconnections between devices as the number of devices increases. When the number and length of interconnections increase, both circuit RC delay and power consumption increase.

Three-dimensional integrated circuits (3DICs) were thus formed, wherein two dies or packages may be stacked, with interconnections formed to connect the dies or packages to another substrate. The dies or packages for stacking may be thin and thus may be damaged or broken during processing.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1:
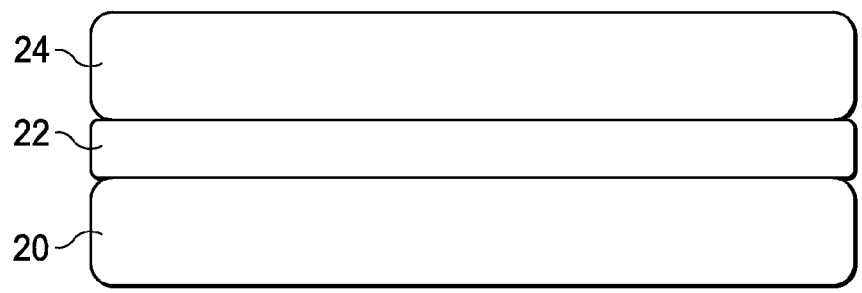
FIGS. 1 through 6 illustrate intermediate stages of bonding and de-bonding a substrate to a carrier in accordance with an embodiment.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a specific context, namely a method of selective curing of adhesive between a carrier and a substrate.

FIGS. 1 through 6 illustrate intermediate stages of bonding and de-bonding a substrate to a carrier in accordance with an embodiment. FIG. 7 illustrates a process flow of the intermediate stages illustrated in FIGS. 1 through 6.

With reference now to FIG. 1, there is shown a substrate 20 applied to a carrier 24 with an adhesive layer 22 (step 702). The substrate 20 may also be referred to as wafer 20. The substrate 20 may comprise a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 20 may comprise a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof. The substrate 20 may be doped with a p-type dopant, such as boron, aluminum, gallium, or the like, although the substrate may alternatively be doped with an n-type dopant, as is known in the art. In some embodiments, the substrate 20 may be based on an insulating core such as a fiberglass reinforced resin core. One example core material is fiberglass resin such as FR4. Alternatives for the core material include bismaleimide-triazine (BT) resin, or alternatively, other PC board materials or films. Build up films such as Ajinomoto build-up film (ABF) or other laminates may be used for substrate 20.

The substrate 20 may include active and passive devices (not shown). As one of ordinary skill in the art will recognize, a wide variety of devices such as transistors, capacitors, resistors, combinations of these, and the like may be used to generate the structural and functional requirements of the design for a semiconductor device. The active and passive devices may be formed using any suitable methods.

A carrier 24 may then be mounted to a backside surface of the substrate 20 through the adhesive layer 22. The adhesive layer 22 may be disposed on the carrier 24. The carrier 24 may be any suitable substrate that provides (during intermediary operations of the fabrication process) mechanical support for substrate 20. The carrier 24 may comprise a wafer comprising glass, silicon (e.g., a silicon wafer), silicon oxide, metal plate, a ceramic material, or the like.

The adhesive layer 22 may be a polymer, such as an epoxy, silicone, silicon rubber, acrylate, urethane, polyimide, a combination thereof, or any other suitable adhesive material that may be cured (e.g. cross-linked) thermally or by an ultraviolet light or laser light. The adhesive layer 22 may be formed by spin coating, chemical vapor deposition (CVD), laminating, or other suitable methods. In some embodiments, the adhesive layer 22 covers substantially the entire surface of the substrate 20.

In some embodiments, the adhesive layer 22 may be disposed on the carrier 24 with the substrate 20 being placed on the adhesive layer 22. In other embodiments, the adhesive layer 22 may be disposed on the substrate 20 with the carrier 24 placed on the adhesive layer 22.

Figure 2:
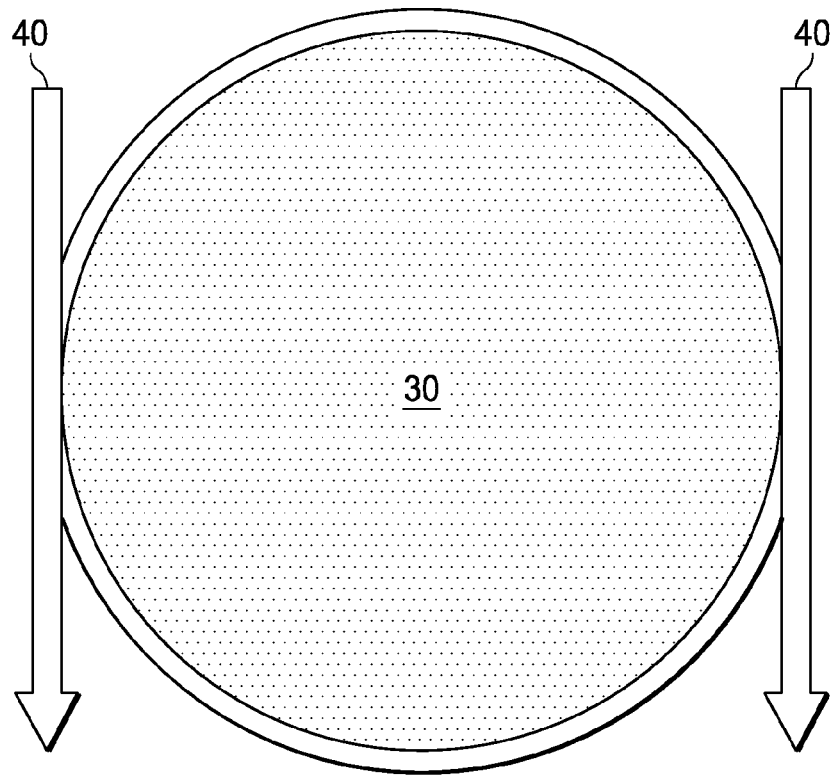
Figure 2:
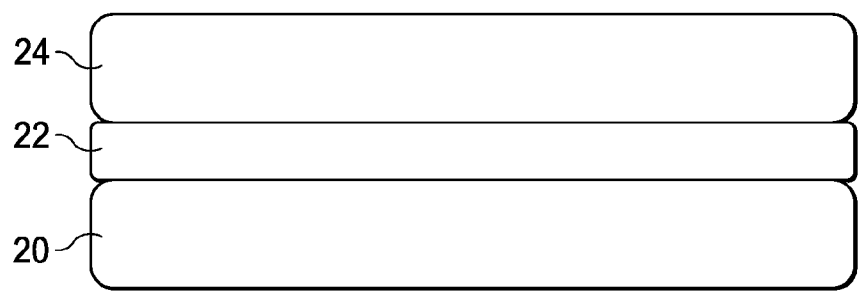

FIG. 2 illustrates the optional step of placing a patterned mask 30 over the substrate 20 (step 704) between the energy source (not shown) supplying the energy 40 to the adhesive layer 22. A patterned mask 30 is placed between the energy source (not shown) and the substrate 20 in order to block portions of the energy 40 from impinging upon portion of the adhesive layer 22. The patterned mask 30 may comprise several layers of material (e.g. absorbance layers, anti-reflective coating layers, shielding layers, etc.). As illustrated in FIG. 2, the patterned mask 30 blocks the energy 40 from all but the outer edges of the substrate 20.

The energy 40 may react with the adhesive layer 22 to cure or cross-link (step 706) those portions of the adhesive layer 22 to which the energy 40 impinges. The chemical alteration may be to cure (or cross-link) the polymers in the adhesive layer 22 such that the adhesive layer 22 is cured or set in those altered portions (see 22A in FIG. 3). The cross-linked portions of adhesive layer 22 may bond more strongly to the carrier 24 and the substrate 20 to provide a stable bonding between them. In an embodiment, the energy 40 may be an electromagnetic radiation or a thermal process, such as ultraviolet radiation, infrared radiation, a laser light, or the like, although any suitable energy may be used. In the embodiments with a laser light energy 40, the patterned mask 30 may be omitted as the laser may direct the energy 40 only at the outer edges (e.g. a ring scan) of the substrate 20. In some embodiments, the energy 40 passes through the carrier 24 to reach and react with the adhesive layer 22.

Figure 3:
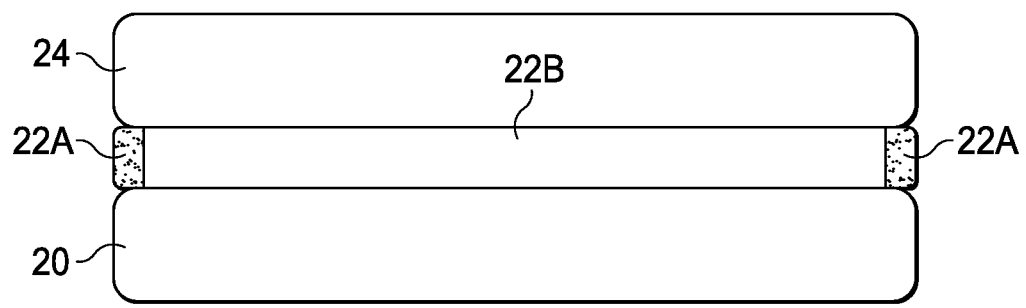

FIG. 3 illustrates the cured (e.g. cross-linked) adhesive layer portion 22A surrounding the uncured (e.g. non-cross-linked) adhesive layer portion 22B. The cured adhesive layer portion 22A may comprise a ring around the uncured portion 22B (see FIG. 6). In some embodiments, the uncured adhesive layer portion 22B substantially aligns with the patterned mask 30. By having the cured portion on the outer edge of the substrate 20, the adhesive layer 22 does not bleed or bulge near the outer edge because the edge portions 22A are cured. Further, the uncured portions 22B are over the main portions of the substrate 20 with structures 60, such as dies, chips, connectors, devices, etc. (see FIGS. 4 and 5) and do not damage these structures 60 when removing the adhesive layer 22 in subsequent processing (see FIGS. 5 and 6). After the adhesive layer 22 is cured, the substrate 20 may undergo backside processing such as thinning, grinding, bonding of dies, formation of devices on substrate, or the like.

Figure 4:
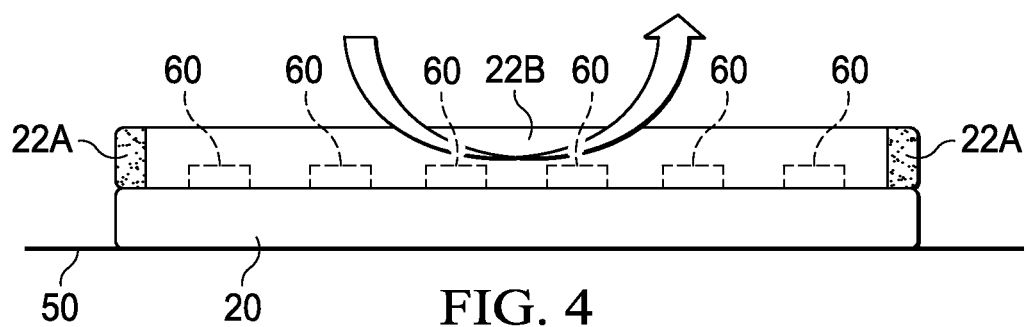

FIG. 4 illustrates the removal of the carrier (step 708). The substrate 20 may be placed on a dicing tape 50 during the removal of the carrier 24. In some embodiments, when the carrier 24 is demounted from the substrate 20, some of the uncured adhesive layer 22B stays on the carrier 24 to make the uncured portions 22B remaining on the substrate 20 thinner than before the carrier 24 was demounted. As illustrated, the structures 60 (e.g. dies, chips, connectors, devices, etc.) are within the uncured portions 22B of the adhesive layer 22. In some embodiments, substantially all of the structures 60 on the substrate 20 are within the uncured portions 22B of the adhesive layer 22.

Figure 5:
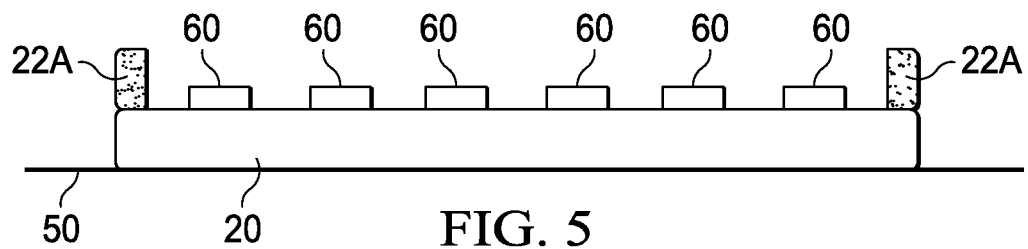

FIG. 5 illustrates the removal of the uncured adhesive layer portions 22B (step 710) to expose the substrate 20 and any structures 60 within the uncured portions 22B. The method used to remove the uncured adhesive layer portions 22B depends on the material of the adhesive layer 22. In some embodiments, the uncured adhesive layer portion 22B may be removed by a solvent such as water. In these embodiments, the solvent is chosen at least in part based upon the materials of the adhesive layer 22. In some embodiments with an organic material adhesive layer 22, the solvent to remove the uncured adhesive layer portion 22B may be acetone, Isopropanol (IPA), N-Methylpyrrolidone (NMP), Dimethyl sulfoxide (DMSO), Terpenes, a combination thereof, or any organic solvent suitable to remove the uncured adhesive layer portion 22B. In some embodiments, substantially the entire uncured (non-cross-linked) adhesive layer portion 22B is removed before the cured adhesive layer portion 22A is removed (see FIG. 6).

Figure 6:
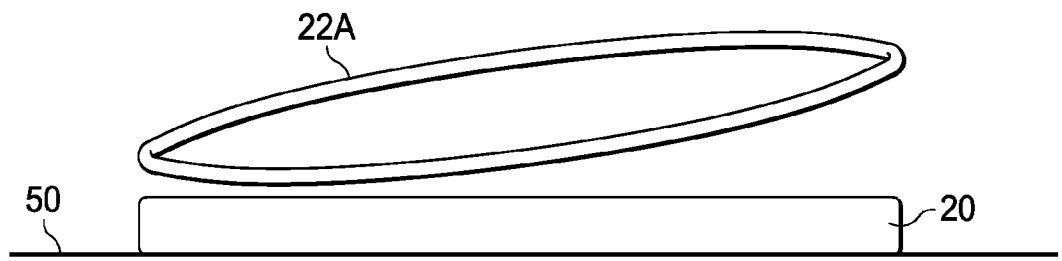
Figure 7:
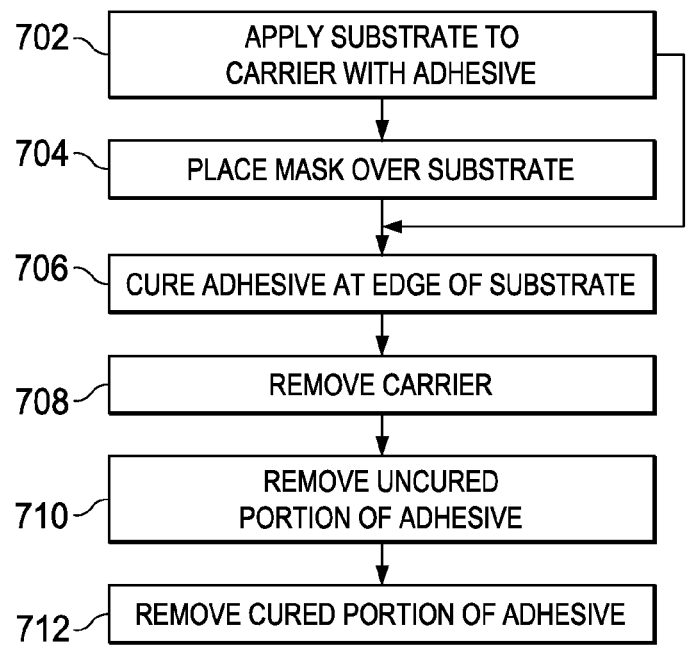
FIG. 7 illustrates a process flow of the process illustrated in FIGS. 1 through 6 in accordance with an embodiment.

FIG. 6 illustrates the removal of the cured adhesive layer portion 22A (step 712). In some embodiments, the cured adhesive layer 22A may comprise a ring or circular shape on the outer edges of the substrate 20. The cured adhesive layer portion 22A may be removed by peeling off the cured adhesive layer portion 22A or any suitable means of removing the cured adhesive layer portion 22A. In some embodiments, the cured adhesive layer portion 22A may be mechanically removed by, for example, a robotic arm or scraper, that peels off the cured adhesive layer portion 22A only at the outer edges of the substrate 20.

By having the cured portion on the outer edge of the substrate 20, the adhesive layer 22 does not bleed or bulge near the outer edge because the edge portions 22A are cured. Further, the uncured portions 22B are over the main portions of the substrate 20 with the structures 60 (e.g. dies, chips, connectors, devices, etc.) and thus the cured adhesive layer portions 22A do not damage these structures 60 when being removed in subsequent processing.

An embodiment is a method for forming a semiconductor device, the method comprising applying a substrate to a carrier with an adhesive layer between the carrier and the substrate, curing a portion of the adhesive layer, the cured portion surrounding an uncured portion of the adhesive layer, and removing the carrier from adhesive layer. The method further comprising removing the uncured portion of the adhesive layer, and removing the cured portion of the adhesive layer.

Another embodiment is a method of forming a semiconductor device, the method comprising forming an adhesive layer on a carrier, placing a substrate on the adhesive layer, and curing an outer portion of the adhesive layer, the cured outer portion surrounding an uncured inner portion of the adhesive layer.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for forming a semiconductor device, the method comprising:
applying a substrate to a carrier with an adhesive layer between the carrier and the substrate;
after the applying, curing a portion of the adhesive layer, the cured portion surrounding an uncured portion of the adhesive layer;
removing the carrier from the adhesive layer;
removing the uncured portion of the adhesive layer; and
removing the cured portion of the adhesive layer.

2. The method of claim 1, wherein the curing a portion of the adhesive layer further comprises exposing a portion of the adhesive layer to an electromagnetic energy, the exposed portion forming the cured portion of the adhesive layer.

3. The method of claim 2, wherein the electromagnetic energy comprises a ultra-violet radiation, a laser light, or a combination thereof.

4. The method of claim 2, wherein the electromagnetic energy passes through the carrier.

5. The method of claim 2, wherein the curing the portion of the adhesive layer further comprises before the exposing the portion of the adhesive layer to the electromagnetic energy, placing a mask over the substrate to block some of the electromagnetic energy.

6. The method of claim 5, wherein the mask substantially aligns with the uncured portion of the adhesive layer.

7. The method of claim 1, wherein the curing the portion of the adhesive layer further comprises performing a laser ring scan on the adhesive layer.

8. The method of claim 1, wherein the cured portion of the adhesive layer substantially forms a ring along an outer edge of the substrate.

9. The method of claim 1, wherein the removing the uncured portion of the adhesive layer further comprises applying a solvent to the uncured portion.

10. The method of claim 1, wherein the removing the cured portion of the adhesive layer further comprises peeling the cured portion of the adhesive layer off of the substrate.

11. The method of claim 1, wherein the removing the carrier removes a portion of the uncured portion of the adhesive layer.

12. A method of forming a semiconductor device, the method comprising:
forming an adhesive layer on a carrier;
placing a substrate on the adhesive layer; and
after the placing the substrate, curing an outer portion of the adhesive layer, the cured outer portion surrounding an uncured inner portion of the adhesive layer.

13. The method of claim 12, wherein the cured outer portion encircles the uncured inner portion.

14. The method of claim 12, wherein the cured outer portion is along outer edges of the substrate.

15. The method of claim 12, wherein the cured outer portion comprises a ring.

16. The method of claim 12, wherein the curing the outer portion further comprises:
applying an energy to the outer portion of the adhesive layer.

17. The method of claim 16, wherein the energy comprises an ultra-violet radiation, a laser light, or a combination thereof.

18. The method of claim 16 further comprising:
placing a mask over the substrate, wherein the energy is blocked from the uncured portion.

19. The method of claim 12 further comprising:
removing the carrier;
applying a solvent to remove the uncured portion of the adhesive layer, the applying step exposing a portion of the substrate; and
peeling the cured portion of the adhesive layer.

20. The method of claim 19, wherein after the peeling the cured portion, substantially all of the adhesive layer is removed from the substrate.

21. A method comprising:
mounting a first substrate to a second substrate with an adhesive layer between the first substrate and the second substrate;
exposing an outer portion of the adhesive layer to an electromagnetic energy, the exposed portion forming a reacted portion of the adhesive layer, the reacted portion of the adhesive layer surrounding an unreacted portion of the adhesive layer, the electromagnetic energy passing through the first substrate;
after exposing, performing one or more processing steps on the second substrate;
after performing one or more processing steps, removing the first substrate from the adhesive layer; and
removing the adhesive layer from the second substrate.

22. The method of claim 21, wherein the removing the adhesive layer further comprises:
removing the unreacted portion of the adhesive layer; and
after removing the unreacted portion, removing the reacted portion of the adhesive layer.

23. The method of claim 21, wherein the exposing the outer portion of the adhesive layer performing a laser ring scan on the adhesive layer.

24. The method of claim 21, wherein the electromagnetic energy comprises a ultra-violet radiation, a laser light, or a combination thereof.

* * * * *